United States Patent
Li

(10) Patent No.: US 11,005,476 B2
(45) Date of Patent: May 11, 2021

(54) LEVEL SHIFT CIRCUIT AND FINGERPRINT IDENTIFICATION DEVICE

(71) Applicant: SHENZHEN GOODIX TECHOLOGY CO., LTD., Guangdong (CN)

(72) Inventor: Bo Li, Guangdong (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 69 days.

(21) Appl. No.: 16/170,912

(22) Filed: Oct. 25, 2018

(65) Prior Publication Data

US 2019/0068192 A1 Feb. 28, 2019

Related U.S. Application Data

(63) Continuation of application No. PCT/CN2017/080421, filed on Apr. 13, 2017.

(51) Int. Cl.
*H03K 19/0185* (2006.01)
*H03K 19/00* (2006.01)
(Continued)

(52) U.S. Cl.
CPC ..... *H03K 19/0013* (2013.01); *G06K 9/00013* (2013.01); *H03K 19/017509* (2013.01);
(Continued)

(58) Field of Classification Search
CPC ..... H03K 19/018521; H03K 19/00315; H03K 19/018528; H03K 3/356113;
(Continued)

(56) References Cited

U.S. PATENT DOCUMENTS 6,307,416 B1 * 10/2001 Heyne .............. H03K 3/356113
327/239
8,169,234 B1 5/2012 Bourstein
(Continued)

FOREIGN PATENT DOCUMENTS

CN 101043211 A 9/2007
CN 101312342 A 11/2008
(Continued)

OTHER PUBLICATIONS

Chinese Office Action issued for Chinese Patent Application No. 201780000328.5 dated Mar. 25, 2020.
(Continued)

*Primary Examiner* — Long Nguyen
(74) *Attorney, Agent, or Firm* — Heslin Rothenberg Farley & Mesiti P.C.

(57) ABSTRACT

A level shift circuit includes a complementary signal generating unit, a high voltage pulse generating unit, and a shift and latch unit. The high voltage pulse generating unit is connected to the complementary signal generating unit and the shift and latch unit. The complementary signal generating unit is used to receive a target signal at a low voltage domain and output a complementary signal of the target signal and the target signal. The high voltage pulse generating unit is used to generate a high voltage pulse according to the target signal and complementary signal. The shift and latch unit is used to shift the target signal from the low voltage domain to a high voltage domain when a high voltage pulse is generated, and is used to latch and output the target signal at the high voltage domain.

6 Claims, 4 Drawing Sheets

(51) Int. Cl.
*G06K 9/00* (2006.01)
*H03K 19/0175* (2006.01)

(52) U.S. Cl.
CPC .............. *H03K 19/018507* (2013.01); *H03K 19/018521* (2013.01)

(58) Field of Classification Search
CPC ....... H03K 19/0013; H03K 19/017509; H03K 19/018507; H03K 19/0175; H03K 19/0185; H03K 19/018514; G06K 9/00013; G06K 9/0002
See application file for complete search history.

(56) References Cited

U.S. PATENT DOCUMENTS

| | | |
|---|---|---|
| 2005/0134355 A1 | 6/2005 | Maede et al. |
| 2006/0208759 A1 | 9/2006 | Nojiri |
| 2007/0247210 A1* | 10/2007 | Maede ............ H03K 3/356113 327/333 |
| 2012/0169395 A1 | 7/2012 | Lee et al. |
| 2017/0308730 A1* | 10/2017 | Sundblad .............. G06F 3/0416 |

FOREIGN PATENT DOCUMENTS

| | | |
|---|---|---|
| CN | 101488742 A | 7/2009 |
| CN | 103178829 A | 6/2013 |
| EP | 0349272 A2 | 1/1990 |
| EP | 0547333 A1 | 6/1993 |
| EP | 2835908 A1 | 2/2015 |
| KR | 20110121236 A | 11/2011 |

OTHER PUBLICATIONS

Extended European Search Report for European Application No. 17905433.3 dated Apr. 18, 2019.

* cited by examiner

LEVEL SHIFT CIRCUIT AND FINGERPRINT IDENTIFICATION DEVICE

CROSS REFERENCE TO RELATED APPLICATIONS

This disclosure is a continuation of international application o. PCT/CN2017/080421, filed on Apr. 13, 2017, which application is hereby incorporated by reference herein, in its entirety.

TECHNICAL FIELD

The present disclosure relates to circuit design technologies and, more particularly, to a level shift circuit and a fingerprint identification device using the level shift circuit.

BACKGROUND

In electronic circuit design, a problem that input and output logic voltage domains are different often occurs in a system, which increases complexity of the system design. For example, when a digital circuit of 1.8V communicates with an analog circuit working at 3.3V, a shift problem between two levels needs to be solved, and a level shift circuit is hereby needed to realize level shift. The level shift circuit is also called a level shifter.

However, there is a problem for a traditional level shift circuit that its static power consumption is high while its signal transmission speed is low, which will affect an overall performance of an electronic device (e.g., a fingerprint identification device) using the level shift circuit.

SUMMARY

Some embodiments of the present disclosure aim to provide a level shift circuit and a fingerprint identification device, which may effectively reduce static power consumption while transmitting a target signal at a high speed.

An embodiment of the present disclosure provides a level shift circuit, including: a complementary signal generating unit, a high voltage pulse generating unit, and a shift and latch unit; the complementary signal generating unit is used to receive a target signal at a low voltage domain and output a complementary signal of the target signal and the target signal; the high voltage pulse generating unit includes a first transistor, a second transistor, a first high voltage transistor, a second high voltage transistor, a first phase inverter, a first delay, a second phase inverter and a second delay; sources of the first transistor and second transistor are grounded, and gates thereof are used to receive the complementary signal and the target signal respectively; the first delay receives the complementary signal through the first phase inverter and the second delay receives the target signal through the second phase inverter; sources of the first high voltage transistor and second high voltage transistor are respectively connected to drains of the first transistor and second transistor, gates thereof are respectively connected to the first delay to receive the target signal and the second delay to receive the complementary signal, and drains thereof are respectively used to generate high voltage pulses; the shift and latch unit is used to shift the target signal from a low voltage domain to a high voltage domain when the high voltage pulse is generated, and is used to latch and output the target signal at the high voltage domain.

An embodiment of the present application also provides a fingerprint identification device, including: a control circuit, a fingerprint sensing chip and the aforementioned level shift circuit; the level shift circuit is connected between the control circuit and the fingerprint sensing chip; the control circuit is used to generate a target signal at the low voltage domain; the level shift circuit is used to receive the target signal at the low voltage domain and output a target signal at the high voltage domain to the fingerprint sensing chip.

Compared with existing technologies, in the present application, in a static state the first transistor and the first high voltage transistor are not be in an ON state at the same time. Thus, there is no turn-on current in the branch where the first transistor and the first high voltage transistor belong. Correspondingly, the second transistor and the second high voltage transistor are not be in the ON state at the same time, and there is no turn-on current in the branch where the second transistor and the second high voltage transistor belong. Therefore, the circuit can transmit the target signals at a high speed without any static power consumption.

Moreover, the shift and latch unit includes a third to a sixth transistors; sources of both the third transistor and fourth transistor are grounded, drains thereof are connected to drains of the fifth transistor and the sixth transistor, and sources of the fifth transistor and six transistor are connected to a voltage source; gates of the third transistor and fifth transistor are connected to the drain of the sixth transistor, and gates of the fourth transistor and sixth transistor are connected to the drain of the fifth transistor; at least one of the drain of the fifth transistor and the drain of the sixth transistor forms an output terminal of the shift and latch unit to output the target signal at the high voltage domain. This embodiment provides a particular structure of the shift and latch unit.

Moreover, the shift and latch unit also includes a seventh transistor and an eighth transistor, sources of both the seventh transistor and eighth transistor are respectively connected to the drains of the third transistor and fourth transistor, and drains and gates of the seventh transistor and eighth transistor are grounded. In this embodiment, the shift and latch unit has the seventh transistor and the eighth transistor preventing the voltages of the third transistor and fourth transistor from being reduced too much so as to protect the third transistor and the fourth transistor.

Moreover, the complementary signal generating unit includes a third phase inverter and a fourth phase inverter connected in series; an input terminal of the third phase inverter is used to receive the target signal at the low voltage domain, an output terminal of the third phase inverter is connected to the gate of the first transistor and the first phase inverter, and the output terminal of the third phase inverter is used to output the complementary signal; an output terminal of the fourth phase inverter is connected to the gate of the second transistor and the second phase inverter, and the output terminal of the fourth inverter is used to output the target signal. This embodiment provides a particular implementing method of the complementary signal generating unit.

Moreover, the shift and latch unit includes a first shift branch, a second shift branch and a sub-latch unit; input terminals of the first shift branch and second shift branch are respectively connected to the voltage source, shift terminals thereof respectively connected to the drains of the first high voltage transistor and second high voltage transistor so as to shift the target signal from the low voltage domain to the high voltage domain; the sub-latch unit connects the shift terminals of the first shift branch and the second shift branch, so as to latch and output the target signal at the high voltage domain. This embodiment also provides another structure of the shift and latch unit.

Moreover, the first shift branch includes a third high voltage transistor and the second shift branch includes a fourth high voltage transistor; sources of the third high voltage transistor and fourth high voltage transistor are connected to the voltage source, gates thereof are grounded, and drains thereof are respectively connected to the drains of the first high voltage transistor and second high voltage transistor and serve as shift terminals of the first shift branch and second shift branch. This embodiment provides a specific structure of the shift branches.

Moreover, the first shift branch includes a fifth high voltage transistor and a ninth high voltage transistor, and the second shift branch includes a sixth high voltage transistor and a tenth transistor; drains of the fifth high voltage transistor and sixth high voltage transistor are respectively connected to the drains of the first high voltage transistor and second high voltage transistor, gates thereof are grounded; sources of the ninth transistor and tenth transistor are connected to the voltage source, gates thereof are grounded, and drains thereof are respectively connected to sources of the fifth high voltage transistor and sixth high voltage transistor and respectively form the shift terminals of the first shift branch and second shift branch. This embodiment provides another particular structure of the shift branch, wherein the ninth transistor and tenth transistor respectively protect the fifth high voltage transistor, the sixth high voltage transistor as well as the sub-latch unit.

Moreover, the sub-latch unit includes an eleventh to a fourteenth transistors and a fifth to a tenth phase inverters; input terminals of the fifth phase inverter and sixth phase inverter are respectively connected to the shift terminals of the first shift branch and second shift branch, and input terminals of the seventh phase inverter and eighth phase inverter are respectively connected to output terminals of the fifth phase inverter and sixth phase inverter; and drains of the eleventh transistor and twelfth transistor are connected, and gates thereof are respectively connected to output terminals of the seventh phase inverter and sixth phase inverter; drains of the thirteenth transistor and fourteenth transistor are connected, and gates thereof are respectively connected to output terminals of the fifth phase inverter and eighth phase inverter; sources of the eleventh transistor and fourteenth transistor are both connected to the voltage source, and sources of the twelfth transistor and thirteenth transistor are both grounded; the ninth phase inverter and the tenth phase inverter are connected end to end, and two connection points are respectively connected to drains of the eleventh transistor and fourteenth transistor and serve as an output terminal of the shift and latch unit. This embodiment provides a particular implementing manner of the sub-latch unit.

Moreover, the level shift circuit also includes a load matching unit connected to the output terminal of the shift and latch unit; wherein the shift and latch unit outputs the target signal at the high voltage domain to the load through the load matching unit. This embodiment adds the load matching unit to the level shift unit so as to meet the need of outputting relative heavy load.

Moreover, the load matching unit includes at least a phase inverter. This embodiment provides a particular implementing manner of the load matching unit.

BRIEF DESCRIPTION OF THE DRAWINGS

One or more embodiments are exemplified by the figures in the corresponding drawings, which does not constitute a limitation to the embodiments. The elements with the same reference numbers in the drawings are represented as similar elements. Unless otherwise stated, the figures in the drawings do not constitute a proportional limitation.

DETAILED DESCRIPTION

In order to make the purpose, the technical solution and the advantages of this application clearer, some embodiments of the present application are explained below in details with reference to the accompanying drawings and embodiments. It should be understood that the specific embodiments described here only explain the application but do not limit the application.

Figure 1:
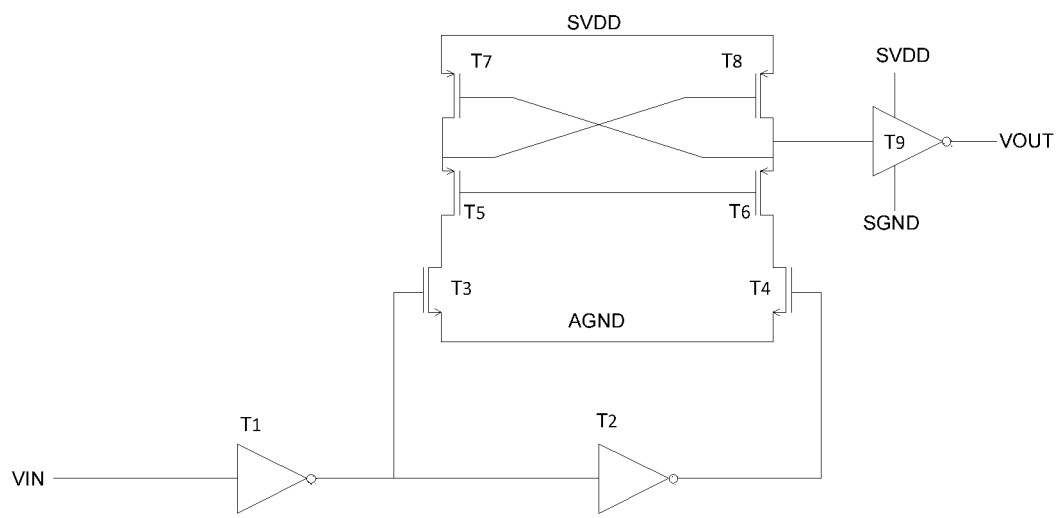
FIG. 1 is a typical circuit diagram of a high voltage level shift circuit.

Refer to FIG. 1 which is a typical circuit diagram of a high voltage level shift circuit. As shown in FIG. 1, the high voltage level shift circuit includes a MOS (Metal Oxide Semiconductor) transistor T1, a MOS transistor T2 and a MOS transistor T9 as phase inverters, as well as a high voltage MOS transistor T3, a high voltage MOS transistor T4, a high voltage MOS transistor T5 and a high voltage MOS transistor T6.

When the high voltage level shift circuit shown in FIG. 1 is in a static state, the MOS transistor T9 has a certain electric leakage because a gate of the MOS transistor T9 cannot be pulled down to a ground potential (SGND), so the high voltage level shift circuit of the circuit structure shown in FIG. 1 will inevitably have static power consumption. Moreover, one of the high voltage MOS transistors T5 and the high voltage MOS transistor T6 works in a weak inversion region, while the other is in a linear region; in this case, there will be a trace amount of leakage current between a source and a drain of the high voltage MOS transistor working in the weak inversion region. It takes the leakage current a long time to become zero. Therefore, working at a high speed will increase the static power consumption of the high voltage level shift circuit.

Besides, when the high voltage level shift circuit is in a working state, a target signal is input to the high voltage level shift circuit. When gate voltage Vgs of the high voltage MOS transistor T5 and the high voltage MOS transistor T6 is close to a turn-on voltage Vth, one of the high voltage MOS transistor T5 and the high voltage MOS transistor T6 needs to enter the linear region from the weak inversion region. This will slow down the speed of the high voltage MOS transistor T5 or high voltage MOS transistor T6 turning into the working state, and then affect the signal transmission speed of the high voltage level shift circuit.

In order to solve the aforementioned problem, this embodiment of the present application provides a level shift circuit which may effectively reduce static power consumption of the circuit while performing the target signal transmission at a high speed.

Figure 2:
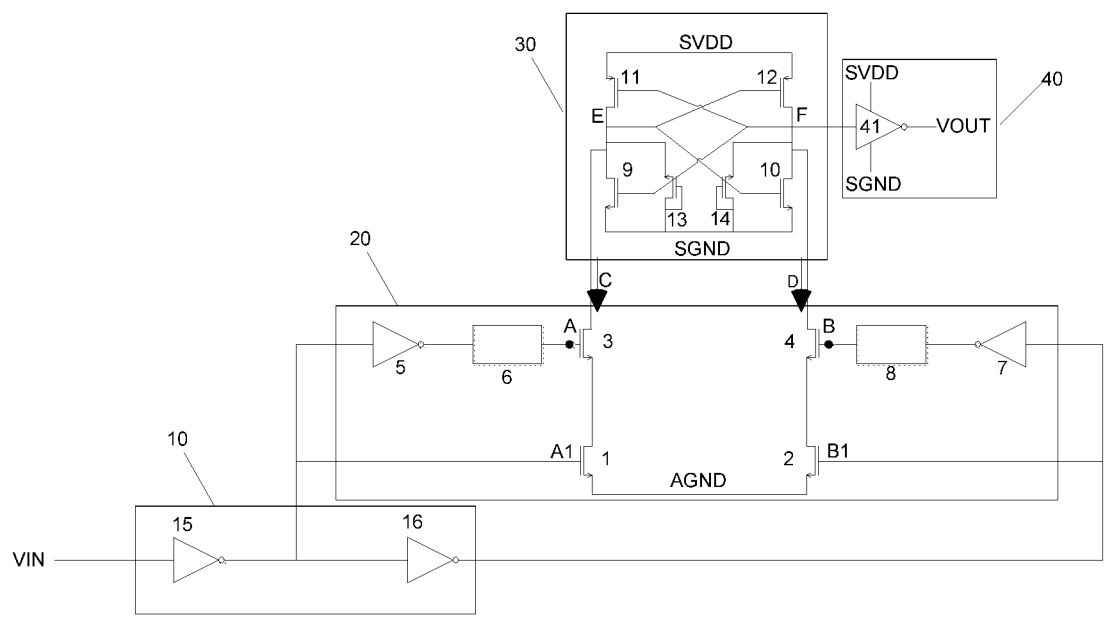
FIG. 2 is a circuit diagram of a level shift circuit according to a first embodiment of this application.

A first embodiment of the application relates to a level shift circuit which can be applied to achieve fast level shift between a low voltage domain and a high voltage domain. With reference to FIG. 2, the level shift circuit includes a complementary signal generating unit 10, a high voltage pulse generating unit 20, and a shift and latch unit 30.

In this embodiment, the high voltage pulse generating unit 20 is connected between the complementary signal generating unit 10 and the shift and latch unit 30; wherein, SVDD represents a floating voltage source, SGND represents a floating ground and AGND represents a solid ground.

The high voltage pulse generating unit 20 is used to generate high voltage pulse according to a target signal and a complementary signal provided by the complementary signal generating unit 10.

The high voltage pulse generating unit 20 includes a first MOS transistor 1, a second MOS transistor 2, a first high voltage MOS transistor 3, a second high voltage MOS transistor 4, a first phase inverter 5, a first delay 6, a second phase inverter 7, and a second delay 8.

Sources of the first MOS transistor 1 and second MOS transistor 2 are connected to the solid ground AGND, the gates thereof are respectively used to receive the complementary signal and the target signal; the first phase inverter 5 and second phase inverter 7 perform a phase inversion processing to the complementary signal and the target signal respectively, thus the first delay 6 receives the target signal through the first phase inverter 5 and the second delay 8 receives the complementary signal through the second phase inverter 7. Sources of the first high voltage MOS transistor 3 and second high voltage MOS transistor 4 are respectively connected to drains of the first MOS transistor 1 and second MOS transistor 2, and gates thereof are respectively connected to the first delay 6 and second delay 8 to receive a delayed target signal and a delayed complementary signal respectively, and drains thereof are used for generating high voltage pulses.

The shift and latch unit 30 is used to shift the target signal from a low voltage domain to a high voltage domain when the high voltage pulse is generated, and is used to latch and output the target signal at the high voltage domain.

The shift and latch unit 30 includes a third MOS transistor 9, a fourth MOS transistor 10, a fifth MOS transistor 11, and a sixth MOS transistor 12; sources of the third MOS transistor 9 and fourth transistor 10 are both connected to the floating ground SGND, and drains thereof are respectively connected to drains of the fifth MOS transistor 11 and sixth MOS transistor 12. Sources of the fifth MOS transistor 11 and sixth MOS transistor 12 are both connected to the voltage source SVDD; gates of the third MOS transistor 9 and fifth MOS transistor 11 are both connected to a drain of the sixth MOS transistor 12, and gates of the fourth MOS transistor 10 and sixth MOS transistor 12 are both connected to a drain of the fifth MOS transistor 11. At least one of drains of the fifth MOS transistor 11 and sixth MOS transistor 12 is used as an output terminal (the drain of the sixth MOS transistor is taken as the output terminal as an example in the figure) of the shift and latch unit 30 to output the target signal at the high voltage domain.

As an alternative embodiment, the drain of the fifth MOS transistor 11 forms a first output terminal of the shift and latch unit 30; the drain of the sixth MOS transistor 12 forms a second output terminal of the shift and latch unit 30; that is, the drain of the fifth MOS transistor 11 and the drain of the sixth MOS transistor 12 respectively form the two output terminals of the shift and latch unit 30. The two output terminals can be respectively connected to two loads or form a pair of differential output signals. However, this is not limited by this embodiment.

In the above embodiments, the third MOS transistor 9, the fourth MOS transistor 10, the fifth MOS transistor 11, and the sixth MOS transistor 12 may be deep-well ordinary-voltage apparatus, but are not limited to this.

Preferably, in this embodiment, the shift and latch unit 30 further includes a seventh MOS transistor 13 and an eighth MOS transistor 14; sources of the seventh MOS transistor 13 and eighth MOS transistor 14 are respectively connected to drains of the third MOS transistor 9 and fourth MOS transistor 10, and gates of the seventh MOS transistor 13 and eighth MOS transistor 14 are respectively connected to drains thereof, and are further connected to the floating ground SGND. The seventh MOS transistor 13 and the eighth MOS transistor 14 can limit a current amplitude in the third MOS transistor 9 and the fourth MOS transistor 10 to prevent voltages in the third MOS transistor 9 and fourth MOS transistor 10 from falling too low, so as to protect the third MOS transistor 9 and the fourth MOS transistor 10.

The complementary signal generating unit 10 is used to receive a target signal at a low voltage domain and output a complementary signal of the target signal (hereinafter referred to as a complementary signal) and the target signal.

The complementary signal generating unit 10 includes a third phase inverter 15 and a fourth phase inverter 16 connected in series; an input terminal of the third phase inverter 15 is used to receive the target signal at the low voltage domain, and the target signal is converted to a complementary signal through a phase inversion processing by the third phase inverter 15; an output terminal of the third phase inverter 15 is connected to the gate of the first MOS transistor 1 and the first phase inverter 5. An output terminal of the third phase inverter 15 is used to output a complementary signal. An input terminal of the fourth phase inverter 16 is connected to the output terminal of the third phase inverter 15, and is used to perform a phase reversion processing on the complementary signal output from the third phase inverter 15 to restore it to the target signal; an output terminal of the fourth phase inverter 16 is connected to a gate of the second MOS transistor 2 and the second phase inverter, and the output terminal of the fourth phase inverter 16 is used to output the target signal.

In this embodiment, the complementary signal generating unit 10 may also include only the third phase inverter 15 to output the complementary signal of the target signal to the first MOS transistor 1 and the first phase inverter 5; besides, the target signal is directly input to the second phase inverter 7 and the second MOS transistor 2, so that it is not necessary to set the fourth phase inverter 16 to restore the complementary signal to the target signal. However, this is not limited in this embodiment.

Preferably, the level shift circuit in this embodiment further includes a load matching unit 40 which is connected to an output terminal of the shift and latch unit 30. The load matching unit 40 includes at least one phase invert 41; the shift and latch unit 30 outputs the target signal at the high voltage domain to the load through the load matching unit 40, which satisfies a need for output of a relative heavy load. A phase inverter 41 of the load matching unit 40 can be a phase inverter composed of deep-well ordinary-voltage apparatus. However, this is not limited in this embodiment.

A principle of the level shift circuit in this embodiment is as follows:

When the level shift circuit is in a static state, no target signal VIN is input to the complementary signal generating unit 10 of the level shift circuit, and the input of the circuit is kept at a low level or high level, that is, the input of the circuit is maintained at a low level of 0 or a high level of 1. That the input of the circuit is kept at a low level of 0 will be taken as an example in the following description. When the input of the circuit is kept at a low level of 0, the input signal is converted to the high level of 1 after being processed by the third phase inverter 15, so the gate of the first MOS transistor 1 receives the high level of 1 and is turned on. However, the high level of 1 received by the first phase inverter 5 is output through the first delay 6 to the first high voltage MOS transistor, and before that, due to the existence of the first phase inverter 5, the signal received by the gate of the first high voltage MOS transistor 3 is a low level of 0; therefore, the level shift circuit is in an off state. At this point, there is no current in the level shift circuit, so there is no static power consumption. When the input of the circuit maintains at a low level of 0, the input signal is converted to a high level of 1 after being processed by the third phase inverter 15, and is converted to a low level of 0 after being processed by the fourth phase inverter 16, the low level received by the second phase inverter 7 is output to the second high voltage MOS transistor 4 through the second delay 8, and before that, due to the existence of the second phase inverter 7, the signal received by the gate of the second high voltage MOS transistor 4 is a high level of 1 and turns it on; however, the signal received by the gate of the second MOS transistor 2 is a low level of 0; therefore, the level shift circuit is in an off state. At this point, there is no current in the level shift circuit, so there is no static power consumption. In view of the foregoing, there is no power consumption when the level shift circuit is in a static state.

Figure 3:
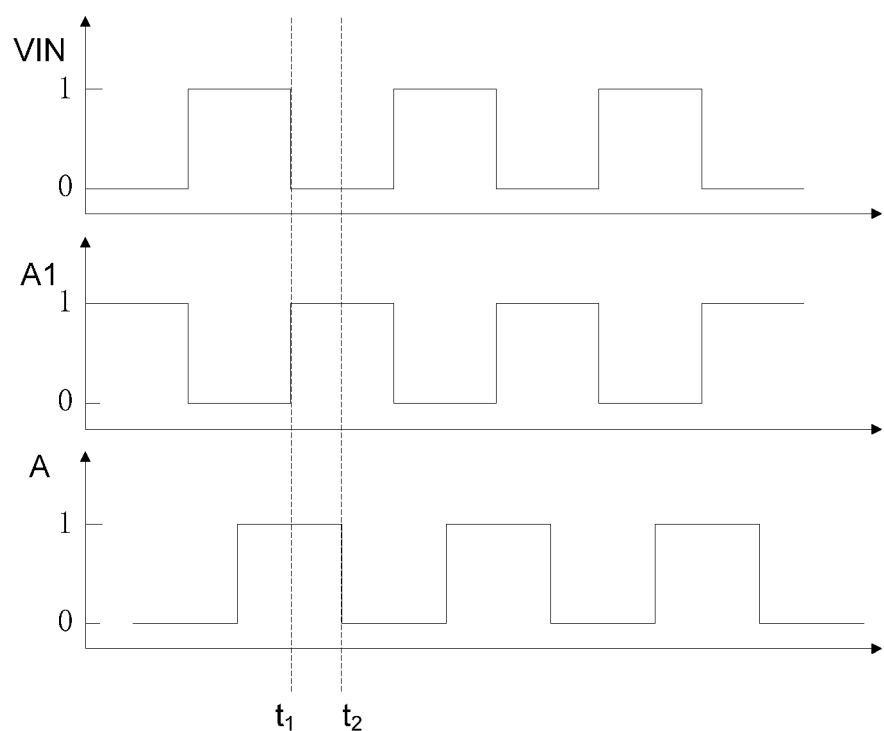
FIG. 3 is a schematic diagram of changes of a target signal input to point A1 and A according to the first embodiment of the present application.

When the level shift circuit is in a working state, the target signal VIN is input to the level shift circuit, and the target signal VIN may be specifically a square wave signal that periodically changes (i.e., from 0 to 1, and from 1 to 0). With reference to FIG. 3, the signal change diagram (that the delay of the first delay 6 is ¼ of a cycle is taken as an example) that the target signal is input from the third phase inverter 15 to a point A1 (i.e., the gate of the first MOS transistor) and that the target signal is input from the third phase inverter 15 to a point A (the gate of the first high voltage MOS transistor 3) through the first delay 6 is taken as an example for description.

When the target signal VIN changes from the low level of 0 to the high level of 1, the target signal VIN is input through the third phase inverter 15 to the point A1 as the low level of 0 (i.e. the complementary signal), and the low level of 0 output by the third phase inverter 15 is converted to the high level of 1 after being converted by the first phase inverter 5; due to the existence of the first delay 6, the signal is not immediately input to the point A, so by the delay, what is input to the point A is the high level of 1. When the target signal VIN changes from the high level of 1 to the low level of 0, the target signal VIN is input through the third phase inverter 15 to the point A1 as the high level of 1. Due to the delay of the first delay 6, the signal input to the point A between the time period of $t_1$ to $t_2$ is still the high level of 1, until after the delay of the first delay 6 (after $t_2$), the signal input to the point A is changed to the low level of 0. Therefore, when the target signals input to the point A1 and the point A are both 1 during the delay (i.e., $t_1$ to $t_2$), the first high voltage MOS transistor 3 and the first MOS transistor 1 are both turned on to form a pulse current C. As can be seen from FIG. 3, the pulse current C is generated only at a falling edge (from 1 to 0) of the target signal VIN, and the duration is a delay (i.e., $t_1$ to $t_2$); when the target signal VIN is in the falling edge, the pulse current C can pull down the level at a point E (i.e., the drain of the fifth MOS transistor 11) (the level of the static state at the E point is the level of the voltage source SVDD, and after being pulled down, it enters the high voltage domain needed by the target signal VIN), i.e., to make the target signal VIN to shift from the low voltage domain to the high voltage domain. The shift and latch unit 30 can latch the level of the high voltage domain, and then output the target signal at the high voltage domain through a point F (i.e. the drain of the sixth MOS transistor 12), or output the target signal at the high voltage domain by the load matching unit 40.

Figure 4:
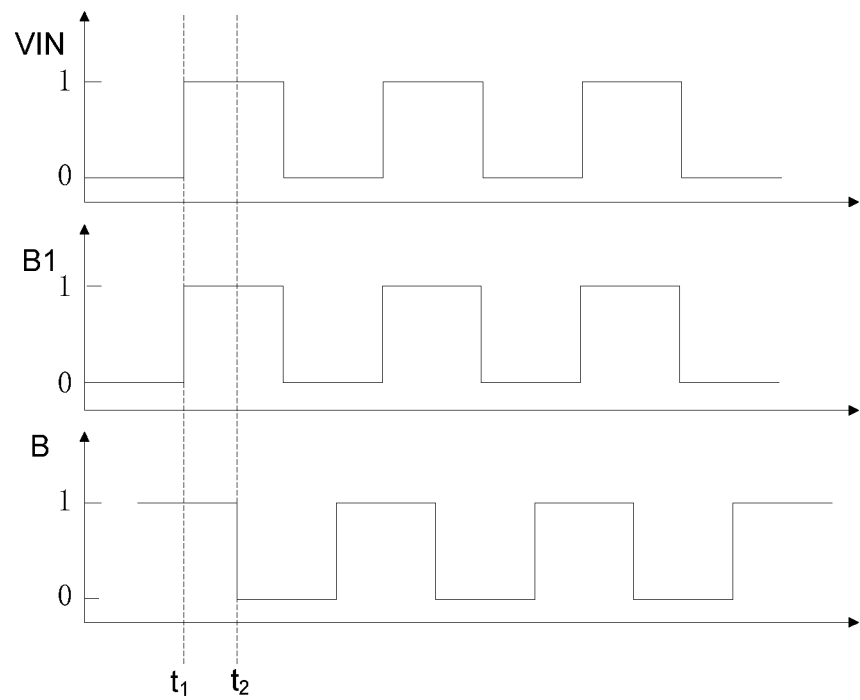
FIG. 4 is a schematic diagram of changes of the target signal input to point B1 and B according to the first embodiment of the present application.

The third phase inverter 15 and the fourth phase inverter 16 enable the target signal VIN to generate two complementary signals at the point A1 (i.e., the gate of the first MOS transistor 1) and a point B1 (i.e., the gate of the second MOS transistor 2). Therefore, a working process that the complementary signal formed by the target signal VIN through the third phase inverter 15 is further input from the fourth phase inverter 16 to the point B1, and that the complementary signal is input from the fourth phase inverter 16 to the point B (i.e., the gate of the second high voltage MOS transistor 4) through the second phase inverter 7 and the second delay 8 are also about the same. Refer to FIG. 4 which is a signal change diagram of the points B1 and B with changes to the target signal VIN (the delay of the second delay 8 is a ¼ of a cycle is taken as an example in the figure). The difference lies in that the pulse current D is generated only when the target signal VIN is in the rising edge (i.e., from 0 to 1). When the target signal VIN is in the rising edge, the pulse current D can pull down the level of the point F (i.e., the drain of the sixth MOS transistor 12) (the level of the static state at the F point is SVDD, and it enters the high voltage domain needed by the target signal after it is pulled down), i.e., to make the target signal VIN to shift from the low voltage domain to the high voltage domain. The shift and latch unit 30 can latch the level and then directly output the target signal at the high voltage domain, or output the target signal at the high voltage domain by the load matching unit 40.

Compared with existing technologies, in this embodiment, when the level shift circuit is in a static state, the first MOS transistor and the first high voltage MOS transistor will not be in the ON state at the same time, so there is no turn-on current in the branch where the first MOS transistor and the first high voltage MOS transistor belong; correspondingly, the second MOS transistor and the second high voltage MOS transistor will not be in the ON state at the same time, and there is no turn-on current in the branch where the second MOS transistor and the second high voltage MOS transistor belong. Therefore, the level shift circuit can effectively reduce the overall static power consumption of the circuit while transmitting the target signal at a high speed.

Figure 5:
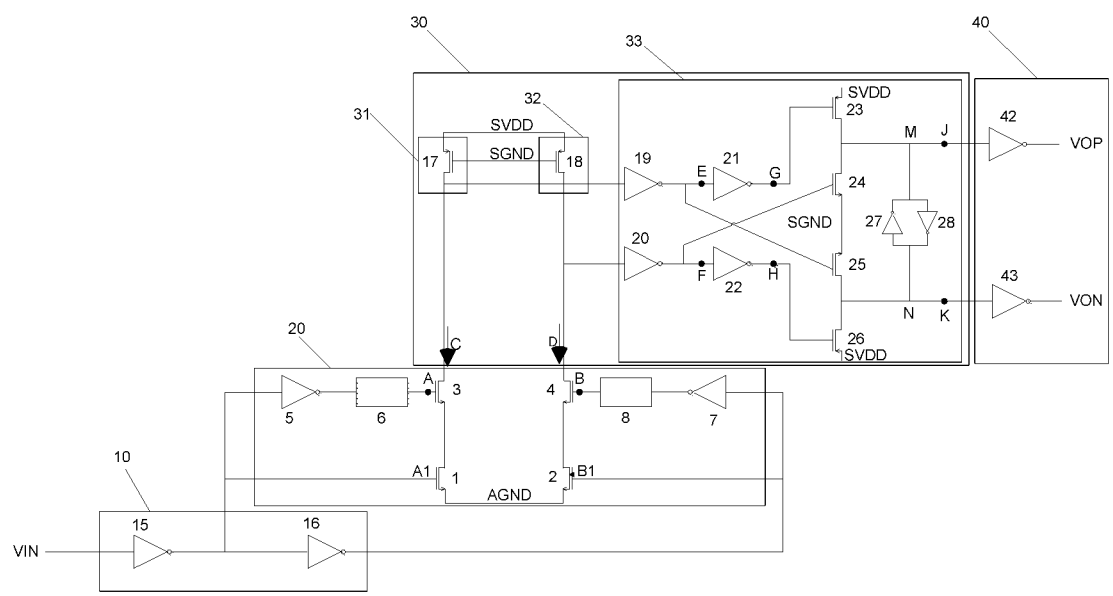
FIG. 5 is a circuit diagram of a level shift circuit according to a second embodiment of this application.

A second embodiment of the present application relates to a level shift circuit, which is roughly the same as the first embodiment, and the main difference is that in this embodiment, with reference to FIG. 5, another structure of the shift and latch unit 30 is provided.

In this embodiment, the shift and latch unit 30 includes a first shift branch 31, a second shift branch 32, and a sub-latch unit 33.

Input terminals of the first shift branch 31 and second shift branch 32 are respectively connected to the voltage source SVDD, and shift terminals of the first shift branch 31 and second shift branch 32 are respectively connected to the drains of the first high voltage MOS transistor 3 and the second high voltage MOS transistor 4, so as to respectively shift the target signal from the low voltage domain to the high voltage domain when high voltage pulses are generated.

The first shift branch 31 includes a third high voltage MOS transistor 17, and the second shift branch 32 includes a fourth high voltage MOS transistor 18; sources of the third high voltage MOS transistor 17 and fourth high voltage MOS transistor 18 are both connected to the voltage source, gates thereof are both connected to the floating SGND, and drains thereof are respectively connected to the drains of the first high voltage MOS transistor 3 and second high voltage MOS transistor 4 and are respectively used as the shift terminals of the first shift branch 31 and second shift branch 32.

The sub-latch unit 33 is connected to the shift terminals of the first shift branch 31 and second shift branch 32 so as to latch and output the target signal at the high voltage domain.

A sub-latch unit 33 includes an eleventh MOS transistor 23, a twelfth MOS transistors 24, a thirteenth MOS transistors 25, a fourteenth MOS transistors 26, a fifth phase inverter 19, a sixth phase inverter 20, a seventh phase inverter 21, an eighth phase inverter 22, a ninth phase inverter 27 and a tenth phase inverter 28; input terminals of the fifth phase inverter 19 and sixth phase inverter 20 are respectively connected to shift terminals of the first shift branch 31 and second shift branch 32 (i.e., the drains of the first high voltage MOS transistor 3 and second high voltage MOS transistor 4), respectively receiving the target signal at the high voltage domain and outputting the target signal at the high voltage domain and that has been through a phase reversion processing; input terminals of the seventh phase inverter 21 and eighth phase inverter 22 are respectively connected to output terminals of the fifth phase inverter 19 and sixth phase inverter 20, receiving the target signal at the high voltage domain and that has been through a reversion processing and outputting the restored target signal at the high voltage domain; drains of the eleventh MOS transistor 23 and twelfth MOS transistor 24 are connected, gates thereof are respectively connected to output terminals of the seventh phase inverter 21 and sixth phase inverter 20, receiving the target signal at the high voltage domain and the target signal at the high voltage domain and that has been through a phase reversion processing; drains of the thirteenth MOS transistors 25 and fourteenth MOS transistors 26 are connected, gates thereof respectively connected to output terminals of the fifth phase inverter 19 and eighth phase inverter 22, receiving the target signal at the high voltage domain and that has been through a phase reversion processing and the target signal at the high voltage domain; sources of the eleventh MOS transistor 23 and fourteenth MOS transistor 26 are both connected to the voltage source SVDD, and sources of the twelfth MOS transistor 24 and thirteenth MOS transistor 25 are both connected to the floating ground SGND; the ninth phase inverter 27 and the tenth phase inverter 28 are connected end to end, and two connection points M and N are respectively connected to drains of the eleventh MOS transistor 23 and fourteenth MOS transistor 26 and are used as the output terminals of the shift and latch unit 30 to latch the target signal at the high voltage domain.

In this embodiment, the load matching unit 40 includes two phase inverters. As two output terminals of the shift and latch unit 30, the connection points M and N are respectively connected to a phase inverter 42 and a phase inverter 43 (this is taken as an example in the figure). Apart from this, the load matching unit 40 may only include one phase inverter with one of the connection points M and N (which are two output terminals of the shift and latch unit 30) connected to the phase inverter.

A principle of the high voltage level shift circuit in this embodiment is as follows:

When the level shift circuit is in a static state, no target signal VIN is input to the complementary signal generating unit 10 of the level shift circuit, and the input of the circuit is kept at a low level or high level, that is, the input of the circuit is maintained at a low level of 0 or a high level of 1. That the input of the circuit is kept at a low level of 0 will be taken as an example in the following description. When the input of the circuit is kept at a low level of 0, the input signal is converted to the high level of 1 after being processed by the third phase inverter 15, so the gate of the first MOS transistor 1 receives the high level of 1 and is turned on; however, the high level of 1 received by the first phase inverter 5 is output through the first delay 6 to the first high voltage MOS transistor, and before that, due to the existence of the first phase inverter 5, the signal received by the gate of the first high voltage MOS transistor 3 is a low level of 0; therefore, the level shift circuit is in an off state. At this point, there is no current in the level shift circuit, so there is no static power consumption; because there is no current in the level shift circuit, the third high voltage MOS transistor 17 will not enter the subthreshold region. When the input of the circuit maintains at a low level of 0, the input signal is converted to the high level 1 after being processed by the third phase inverter 15, then is converted to a low level 0 after being processed by the fourth phase inverter 16, and the low level received by the second phase inverter 7 is output to the second high voltage MOS transistor 4 through the second delay device 8, and before that, due to the existence of the second phase inverter 7, the signal received by the gate of the second high voltage MOS transistor 4 is the high level 1 and turns it on; however, the signal received by the gate of the second MOS transistor 2 is a low level of 0; therefore, the level shift circuit is in an off state. At this point, there is no current in the level shift circuit, so there is no static power consumption; because there is no current in the level shift circuit, the fourth high voltage MOS transistor 18 will not enter the subthreshold region. In view of the foregoing, there is no power consumption when the level shift circuit is in a static state. Moreover, since the third high voltage MOS transistor 17 and the fourth high voltage MOS transistor 18 do not enter the subthreshold region, it will not affect the high speed transmission of the signal when the level shift circuit enters from the static state into a working state.

When the level shift circuit is in the working state, the target signal VIN is input to the level shift circuit, and the target signal VIN may be specifically a square wave signal that periodically changes (i.e., from 0 to 1, and from 1 to 0). With reference to FIG. 3, the signal change diagram (that the delay of the first delay 6 is ¼ of a cycle is taken as an example) that the target signal is input from the third phase inverter 15 to the point A1 (i.e., the gate of the first MOS transistor) and through the first delay 6 to the point A (the gate of the first high voltage MOS transistor 3) is taken as an example for description.

When the target signal VIN changes from the low level of 0 to the high level of 1, the target signal VIN is through the third phase inverter 15 input to the A1 point as the low level of 0 (i.e. a complementary signal), and the low level of 0 output by the third phase inverter 15 is converted to the high level of 1 after being processed by the first phase inverter 5; due to the existence of the first delay 6, the target signal is not immediately input to the point A, so through the delay, what is input to the point A is the high level of 1. When the target signal VIN changes from the high level of 1 to the low level of 0, the target signal VIN is input through the third phase inverter 15 to the point A1 as the high level of 1. Due to the delay of the first delay 6, the signal input to the point A between the time period of $t_1$ to $t_2$ is still the high level 1, until after the delay of the first delay 6 (after $t_2$), the signal input to the point A is changed to the low level of 0. Therefore, when the target signals input to the point A1 and the point A are both 1 during the delay (i.e., $t_1$ to $t_2$), A1 and A are turned on through the first high voltage MOS transistor 3 and the first MOS transistor 1 to form a pulse current C. As can be seen from FIG. 3, the pulse current C is generated only at a falling edge (from 1 to 0) of the target signal VIN, and the duration is a delay (i.e., $t_1$ to $t_2$); when the target signal VIN is in the falling edge, the pulse current C enters the input terminal of the fifth phase inverter 19 from the shift terminal of the first shift branch 31 (i.e., the drain of the third high voltage MOS transistor 17), and generates a downward pulse voltage at the input terminal of the fifth phase inverter 19, and a point E (i.e., the input of the seventh phase inverter 21) generates an upward pulse voltage, the pulse voltage is simultaneously transmitted into the gate of thirteenth MOS transistor 25, a point G (i.e., the gate of eleventh MOS transistor 23) generates a downward pulse voltage, at this time, the eleventh MOS transistors 23 and thirteenth MOS transistors 25 are turned on, and a level of a point J (i.e. the drain of the eleventh MOS transistor 23) is pulled to the voltage source SVDD, and a level of a point K (i.e., the drain of the fourteenth MOS transistor 26) is pulled to the floating terminal SGND. The ninth phase inverter 27 and tenth phase inverter 28 can latch the levels of the high voltage domain of the two points, then directly output the target signal VIN at the high voltage domain, or output the target signal VIN at the high voltage domain by the load matching unit 40.

The third phase inverter 15 and the fourth phase inverter 16 enable the target signal VIN to generate two complementary signals at the point A1 (i.e., the gate of the first MOS transistor 1) and the point B1 (i.e., the gate of the second MOS transistor 2). Therefore, a working process that the complementary signal formed by the target signal VIN through the third phase inverter 15 is further input from the fourth phase inverter 16 to the point B1, and that the complementary signal is input from the third phase inverter 15 to the point B (i.e., the gate of the second high voltage MOS transistor 4) through the second phase inverter 7 and the second delay 8 are also about the same. Refer to FIG. 4 which is a signal change diagram of the points B1 and B with changes to the target signal VIN (the delay of the second delay 8 is a ¼ of a cycle is taken as an example in the figure). The difference lies in that the pulse current D is generated only when the target signal VIN is in the rising edge (i.e., from 0 to 1). When the target signal VIN is in the rising edge, the pulse current D enters the input terminal of the sixth phase inverter 20 from the shift terminal of the second shift branch 32 (i.e., the drain of the fourth high voltage MOS transistor 18), and generates an upward pulse voltage at the input terminal of the sixth phase inverter 20, and the point F (i.e., the input of the eighth phase inverter 22) generates a downward pulse voltage, the pulse voltage is simultaneously input to the gate of the twelfth MOS transistor 24, the point H (i.e., the gate of fourteenth MOS transistor 26) generates an upward pulse voltage, at this time, the twelfth MOS transistors 24 and fourteenth MOS transistors 26 are turned on, and the level of the point K (i.e. the drain of the fourteenth MOS transistor 26) is pulled to the voltage source SVDD, and the level of the point J (i.e., the drain of the eleventh MOS transistor 23) is pulled to the floating terminal SGND. The ninth phase inverter 27 and tenth phase inverter 28 can latch the levels of the high voltage domain of the two points, then directly output the target signal VIN at the high voltage domain, or output the target signal VIN at the high voltage domain by the load matching unit 40.

Compared with the first embodiment, this embodiment provides another specific structure of the shift and latch unit.

Figure 6:
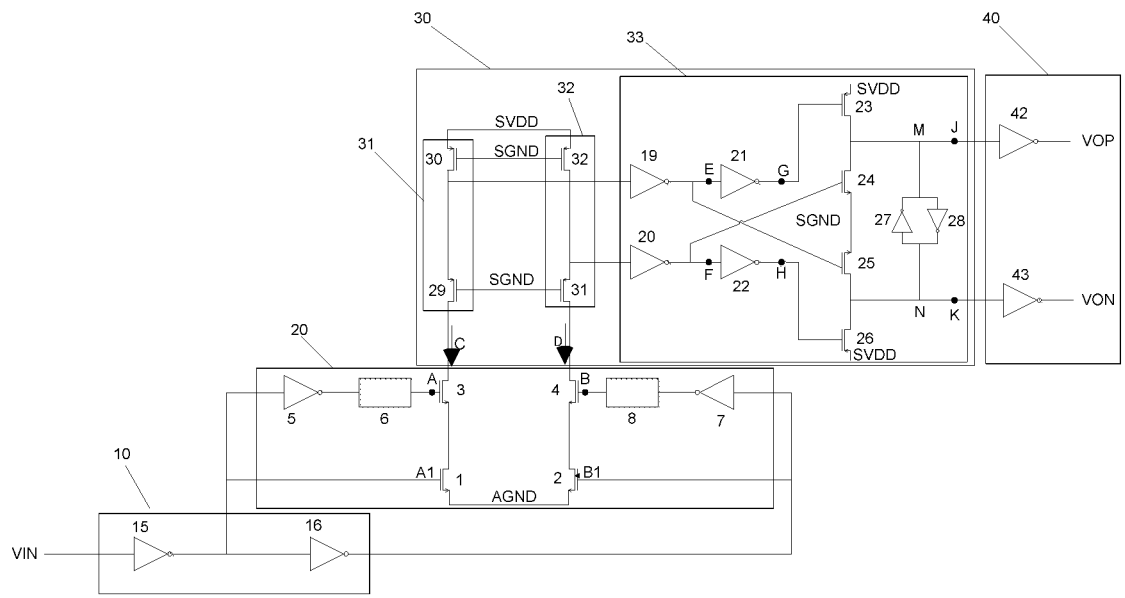
FIG. 6 is a circuit diagram of a level shift circuit according to a third embodiment of this application.

A third embodiment of the application relates to a level shift circuit, which is roughly the same as the second embodiment, and the main difference is that in this embodiment, with reference to FIG. 6, another structure of a shift branch is provided.

In this embodiment, a first shift branch 31 includes a fifth high voltage MOS transistor 29 and a ninth MOS transistor 30, and a second shift branch 32 includes a sixth high voltage MOS transistor 31 and a tenth MOS transistor 32.

Drains of the fifth high voltage MOS transistor 29 and sixth high voltage MOS transistor 31 are respectively connected to the drains of the first high voltage MOS transistor 3 and second high voltage MOS transistor 4, gates thereof both connected to a floating ground SGND; sources of the ninth MOS transistor 30 and tenth MOS transistor 32 are connected to the voltage source, gates thereof both connected to the floating ground SGND, and drains of the ninth MOS transistor 30 and tenth MOS transistor 32 respectively connected to the sources of the fifth high voltage MOS transistor 29 and sixth high voltage MOS transistor 31 and respectively serve as shift terminals of the first shift branch 31 and second shift branch 32.

A principle of the high voltage level shift circuit in this embodiment is about the same as that in the second embodiment and will not be repeated.

Compared with the second embodiment, this embodiment provides another structure of the shift branch, and the ninth MOS transistor and tenth MOS transistor protect the fifth high voltage MOS transistors and the sixth high voltage MOS transistor and the sub-latch unit respectively.

Figure 7:
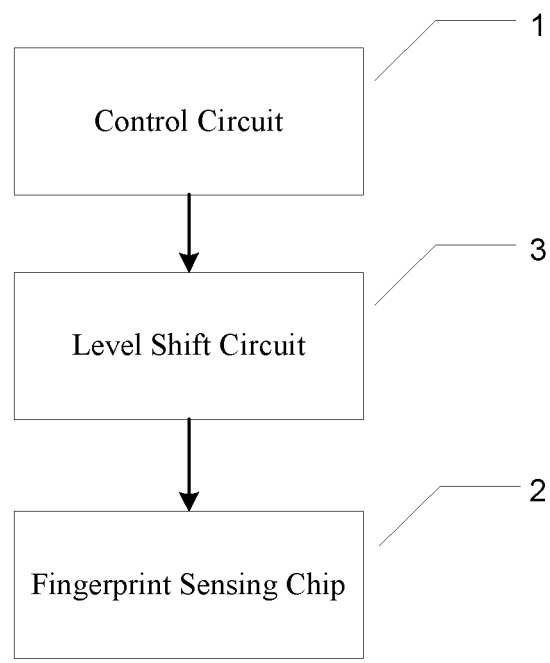
FIG. 7 is a block schematic diagram of a fingerprint identification device according to a fourth embodiment of this application.

A fourth embodiment of the application relates to a fingerprint identification device. In this embodiment, with reference to FIG. 7, the fingerprint identification device includes a control circuit 1, a fingerprint sensing chip 2 and the level shift circuit 3 described in any one of the first embodiment to the third embodiment.

The level shift circuit 3 is connected between the control circuit 1 and the fingerprint sensing chip 2;

The control circuit 1 is used to generate a target signal at a low voltage domain (e.g., 1.8V);

The level shift circuit 3 is used to receive the target signal at the low voltage domain and output a target signal at a high voltage domain (e.g., being 3.6 to 14.4V) to the fingerprint sensing chip 2.

In this embodiment, the control circuit 1 generates the target signal at the low voltage domain and transmits it to the level shift circuit 3. After being shifted by the level shift circuit 3, the target signal at the low voltage domain is shifted to the target signal at the high voltage domain which is then output to the fingerprint sensing chip 2.

Compared with the prior art, the present embodiment provides a fingerprint identification device capable of shifting a target signal from a low voltage domain to a high voltage domain.

Those ordinarily skilled in the art may understand that the above-mentioned embodiments are specific embodiments for implementing this application. In practical applications, various changes can be made in form and in detail without deviating from the spirit and scope of the application.

What is claimed is:

1. A level shift circuit, comprising: a complementary signal generating unit, a high voltage pulse generating unit, and a shift and latch unit, wherein:

the complementary signal generating unit is used to receive a first target signal at a low voltage domain and output a complementary signal of the first target signal and a second target signal generated based on the first target signal;

the high voltage pulse generating unit comprises a first transistor, a second transistor, a first high voltage transistor, a second high voltage transistor, a first phase inverter, a first delay, a second phase inverter and a second delay; sources of the first transistor and second transistor are grounded, and a gate of the first transistor is used to receive the complementary signal and a gate of the second transistor is used to receive the second target signal; the first delay receives the complementary signal through the first phase inverter and the second delay receives the second target signal through the second phase inverter; sources of the first high voltage transistor and second high voltage transistor are respectively connected to drains of the first transistor and second transistor, a gate of the first high voltage transistor is connected to the first delay to receive the complementary signal through the first phase inverter and a gate of the second high voltage transistor is connected to the second delay to receive the second target signal through the second phase inverter, and drains of the first high voltage transistor and second high voltage transistor are respectively used to generate high voltage pulses; and the shift and latch unit is used to shift the complementary signal and the second target signal from the low voltage domain to a high voltage domain when each high voltage pulse is generated, and is used to latch and output a target signal at the high voltage domain;

wherein: the shift and latch unit comprises a first shift branch, a second shift branch and a sub-latch unit;

input terminals of the first shift branch and second shift branch are respectively connected to a voltage source, and shift terminals of the first shift branch and second shift branch are respectively connected to the drains of the first high voltage transistor and second high voltage transistor, to respectively shift the complementary signal and the second target signal from the low voltage domain to the high voltage domain when each high voltage pulse is generated; and the sub-latch subunit is connected to the shift terminals of the first shift branch and second shift branch to latch and output the target signal at the high voltage domain;

wherein: the first shift branch comprises a fifth high voltage transistor and a ninth high voltage transistor, and the second shift branch comprises a sixth high voltage transistor and a tenth high voltage transistor; and drains of the fifth high voltage transistor and sixth high voltage transistor are respectively connected to the drains of the first high voltage transistor and second high voltage transistor, gates of the fifth high voltage transistor and sixth high voltage transistor are grounded; sources of the ninth high voltage transistor and tenth high voltage transistor are connected to the voltage source, gates of the ninth high voltage transistor and tenth high voltage transistor are grounded, and drains of the ninth high voltage transistor and tenth high voltage transistor are respectively connected to sources of the fifth high voltage transistor and sixth high voltage transistor and respectively form the shift terminals of the first shift branch and second shift branch.

2. The level shift circuit according to claim 1, wherein: the complementary signal generating unit comprises a third phase inverter and a fourth phase inverter connected in series;

an input terminal of the third phase inverter is used to receive the first target signal at the low voltage domain, an output terminal of the third phase inverter is connected to the gate of the first transistor and the first phase inverter, and the output terminal of the third phase inverter is used to output the complementary signal; and an output terminal of the fourth phase inverter is connected to the gate of the second transistor and the second phase inverter, and the output terminal of the fourth phase inverter is used to output the second target signal.

3. The level shift circuit according to claim 1, wherein the sub-latch unit comprises an eleventh to a fourteenth transistors and a fifth to a tenth phase inverters;

input terminals of the fifth phase inverter and sixth phase inverter are respectively connected to the shift terminals of the first shift branch and second shift branch, and input terminals of the seventh phase inverter and eighth phase inverter are respectively connected to output terminals of the fifth phase inverter and sixth phase inverter; and drains of the eleventh transistor and twelfth transistor are connected, and gates of the eleventh transistor and twelfth transistor are respectively connected to an output terminal of the seventh phase inverter and the output terminal of the sixth phase inverter; drains of the thirteenth transistor and fourteenth transistor are connected, and gates of the thirteenth transistor and fourteenth transistor are respectively connected to the output terminal of the fifth phase inverter and an output terminal of the eighth phase inverter; sources of the eleventh transistor and fourteenth transistor are connected to the voltage source, and sources of the twelfth transistor and thirteenth transistor are grounded; a ninth phase inverter and a tenth phase inverter are connected end to end, and two connection points are respectively connected to the drains of the eleventh transistor and fourteenth transistor and serve as output terminals of the shift and latch unit.

4. The level shift circuit according to claim 1, wherein the level shift circuit also comprises a load matching unit connected to an output terminal of the shift and latch unit, and wherein the shift and latch unit outputs the target signal at the high voltage domain to the load through the load matching unit.

5. The level shift circuit according to claim 4, wherein the load matching unit comprises at least one phase inverter.

6. A fingerprint identification device, comprising: a control circuit, a fingerprint sensing chip, and a level shift circuit; wherein: the level shift circuit is connected between the control circuit and the fingerprint sensing chip; and the control circuit is used to generate a first target signal at a low voltage domain;

wherein the level shift circuit comprises a complementary signal generating unit, a high voltage pulse generating unit, and a shift and latch unit;

the complementary signal generating unit is used to receive the first target signal at the low voltage domain and output a complementary signal of the first target signal and a second target signal generated based on the first target signal;

the high voltage pulse generating unit comprises a first transistor, a second transistor, a first high voltage transistor, a second high voltage transistor, a first phase inverter, a first delay, a second phase inverter and a second delay; sources of the first transistor and second transistor are grounded, and a gate of the first transistor is used to receive the complementary signal and a gate of the second transistor is used to receive the first or second target signal; the first delay receives the complementary signal through the first phase inverter and the second delay receives the second target signal through the second phase inverter; sources of the first high voltage transistor and second high voltage transistor are respectively connected to drains of the first transistor and second transistor, a gate of the first high voltage transistor is connected to the first delay to receive the complementary signal through the first phase inverter and a gate of the second high voltage transistor is connected to the second delay to receive the second target signal through the second phase inverter, and drains of the first high voltage transistor and second high voltage transistor are respectively used to generate high voltage pulses; and the shift and latch unit is used to shift the complementary signal and the second target signal from the low voltage domain to a high voltage domain when each high voltage pulse is generated, and is used to latch and output a target signal at the high voltage domain;

wherein: the shift and latch unit comprises a first shift branch, a second shift branch and a sub-latch unit;

input terminals of the first shift branch and second shift branch are respectively connected to a voltage source, and shift terminals of the first shift branch and second shift branch are respectively connected to the drains of the first high voltage transistor and second high voltage transistor, to respectively shift the complementary signal and the second target signal from the low voltage domain to the high voltage domain when each high voltage pulse is generated; and the sub-latch subunit is connected to the shift terminals of the first shift branch and second shift branch to latch and output the target signal at the high voltage domain;

wherein: the first shift branch comprises a fifth high voltage transistor and a ninth high voltage transistor, and the second shift branch comprises a sixth high voltage transistor and a tenth high voltage transistor; and drains of the fifth high voltage transistor and sixth high voltage transistor are respectively connected to the drains of the first high voltage transistor and second high voltage transistor, gates of the fifth high voltage transistor and sixth high voltage transistor are grounded; sources of the ninth high voltage transistor and tenth high voltage transistor are connected to the voltage source, gates of the ninth high voltage transistor and tenth high voltage transistor are grounded, and drains of the ninth high voltage transistor and tenth high voltage transistor are respectively connected to sources of the fifth high voltage transistor and sixth high voltage transistor and respectively form the shift terminals of the first shift branch and second shift branch.

* * * * *